(12) United States Patent
Estes et al.

(10) Patent No.: US 10,801,318 B1
(45) Date of Patent: Oct. 13, 2020

(54) DIRECTIONAL SENSOR WITH MEANS FOR ADJUSTING CANCELLATION OF INTERFERING ELECTROMAGNETIC FIELD

(71) Applicant: HALLIBURTON ENERGY SERVICES, INC., Houston, TX (US)

(72) Inventors: Robert Alan Estes, Tomball, TX (US); Randolph Depoo, Houston, TX (US); Mark Wayne Hayenga, Bryan, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 0 days.

(21) Appl. No.: 16/458,171

(22) Filed: Jun. 30, 2019

(51) Int. Cl.
*G01V 3/00* (2006.01)
*E21B 47/09* (2012.01)
*G01R 33/00* (2006.01)
*G01R 15/18* (2006.01)

(52) U.S. Cl.
CPC .............. *E21B 47/09* (2013.01); *G01R 15/18* (2013.01); *G01R 33/0017* (2013.01); *G01R 33/0023* (2013.01); *G01R 33/0094* (2013.01)

(58) Field of Classification Search
CPC ............ G01R 33/0017; G01R 33/0023; G01R 33/0094; G01R 33/028; G01R 33/0283; G01R 33/0286; G01R 33/0385; G01R 33/025; G01R 33/0206; G01R 33/06; G01R 33/063; G01R 33/09; G01R 33/093; G01R 33/0052; G01R 33/18; G01R 15/18; G01R 15/207
See application file for complete search history.

(56) References Cited

U.S. PATENT DOCUMENTS

| | | | | |
|---|---|---|---|---|
| 7,583,073 B2* | 9/2009 | Kumar | .................... | G01R 33/07 324/117 R |
| 8,680,843 B2* | 3/2014 | Ausserlechner | ..... | G01R 33/072 324/126 |
| 2013/0015843 A1* | 1/2013 | Doogue | ............... | G01R 15/148 324/202 |
| 2019/0018046 A1* | 1/2019 | Shimizu | ............... | G01R 33/063 |

* cited by examiner

*Primary Examiner* — Thang X Le
(74) *Attorney, Agent, or Firm* — Polsinelli PC

(57) ABSTRACT

Techniques for mitigating magnetic sensor errors are contemplated. In some aspects, the disclosed technology provides a method for reducing measurement errors in a directional module of a drilling system that includes steps for: receiving a current measurement from a current sensor, wherein the current measurement is associated with electrical current received at the current sensor via a first conductive branch and a second conductive branch, receiving a field measurement from a magnetic sensor, and associating the current measurement from the current sensor with the field measurement from the magnetic sensor. Systems and machine-readable media are also provided.

20 Claims, 10 Drawing Sheets

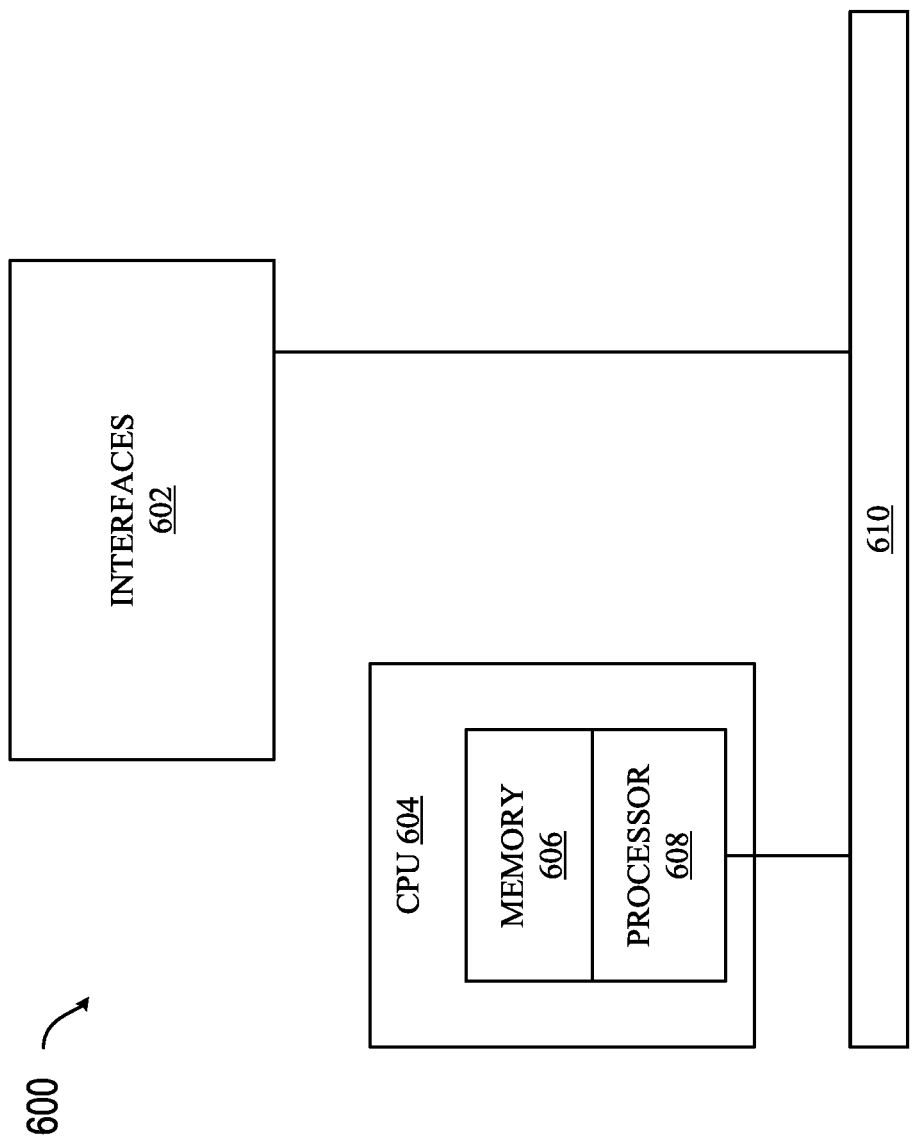

DIRECTIONAL SENSOR WITH MEANS FOR ADJUSTING CANCELLATION OF INTERFERING ELECTROMAGNETIC FIELD

TECHNICAL FIELD

The present disclosure pertains to downhole directional sensors and in particular, to systems and methods for reducing magnetic directional sensor error caused by electromagnetic interference (EMI) induced by close proximity power conductors.

BACKGROUND

Various tools and tool systems have been developed to facilitate the exploration and production of hydrocarbon wells. In such applications, boreholes are frequently drilled toward a particular target, and thus is it necessary to repeatedly determine the drill bit's position or orientation within the borehole. Drill bit positions are typically ascertained by placing an array of accelerometers and magnetic sensors (e.g., magnetometers) near the bit, which measure the earth's gravity and magnetic fields, respectively. Magnetometers help detect the azimuth (direction) of the drilling tools near the drill bit when used in conjunction with accelerometers, which also determine the inclination of the drilling tool. In typical operation, outputs of these sensors are conveyed to the earth's surface and processed by a drilling operator. Using successive measurements made as the borehole is drilled, the bit's "present position" (PP) in three-dimensions can be determined and used to facilitate directional drilling.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which:

FIG. 6 is a schematic diagram of an example system embodiment, in accordance with some aspects of the disclosed technology.

DETAILED DESCRIPTION

Figure 1A:
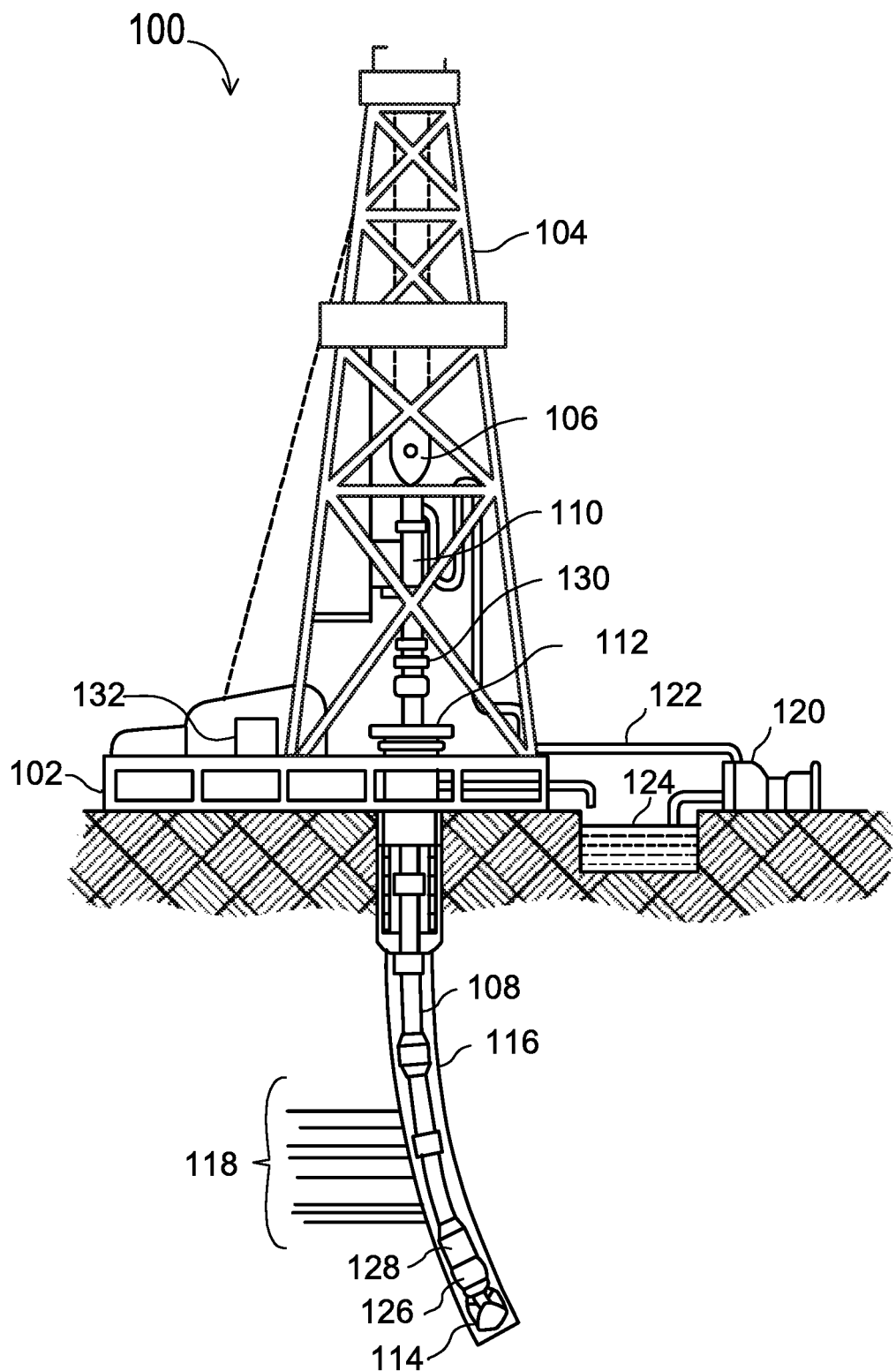
FIG. 1A is a schematic diagram of an example drilling environment, in accordance with various aspects of the subject technology.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Additional features and advantages of the disclosure will be set forth in the description which follows, and in part will be obvious from the description, or can be learned by practice of the principles disclosed herein. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Exploration and production of hydrocarbons generally involves the use of various tools that are lowered into or used to create a borehole, such as drilling assemblies, measurement tools, or production devices. Various components may be disposed downhole for various purposes, such as control of downhole tools, communication with the surface and storage and analysis of data. The components may include, for example, electronic components, sensors, power supplies, batteries and the like. Many of these components are sensitive or include sensitive parts. However, the downhole environments are quite harsh and may include extreme temperatures, pressures, vibrations, and/or other thermo-mechanical stresses. Even prior to being installed in a downhole tool for use, transporting the components and the downhole tool to remote field locations can involve difficult conditions that impose additional stresses.

Downhole directional sensors typically include a magnetic sensor having at least three magnetometers for respectively performing x, y, and z-axis measurements of the earth's magnetic field. The earth's magnetic field is basically constant for short durations at any given point in space, so the objective is to measure the local constant component of the field in each of the three orthogonal axes. From the constituent x, y, and z-axis components, angular orientation with respect to the earth's gravity and magnetic fields can be calculated. Because the accuracy of tool positioning heavily depends on magnetometer measurement accuracy, it is important to mitigate or compensate for magnetic measurement errors. Often this can be accomplished in simple directional drilling tools by positioning the magnetometer far from interfering magnetic fields generated by ferromagnetic drill string components or from electromagnetic interference sources. However, such remote positioning is not always possible or practical in more complex drilling and logging tools. In typical downhole deployments, power supplies (e.g., batteries, etc.), providing power to the directional sensor and adjacent other tools can cause electromagnetic interference, e.g., via stray EM fields emanating from various electrical power rails (supply lines). This EM field is created whether the power rail is carrying DC (direct current) or AC (alternating current) power. The relationship between the electrical current flowing in a conductor at a distance from a magnetic sensor, and the magnetic field produced at the sensor, was demonstrated by Hans Christian Orsted in 1820. Rogue EM field interference can cause significant measurement errors. For example, the earth's magnetic field is approximately 50,000 nanoteslas (nT), however, a 1A power line in close proximity (2 cm) to a directional module can induce an error of approximately 10,000 nT. Orsted's equation shows this relationship, where an electric field (B) surrounding a straight conductor is given by the relationships of equation (1):

$$B = \frac{\mu 0 I}{2\pi r} \quad (1)$$
$$B = \frac{4\pi e - 7}{2\pi} * \frac{I}{r}$$
$$B = 2e - 7 * \frac{I}{r}$$

Theoretically, this type of electromagnetic interference (EMI) can be mitigated using an ideal current return path, i.e., in which the return (ground) current is equal to the forward (supplied) current. The power and return should be physically close to minimize the stray field external to the power/return pair. This is typically implemented via twisted pairs of conductors. However, in real-world (downhole) implementations, where the ground path is often provided through a module chassis, the forward and reverse (ground) currents are typically unequal in the vicinity of the magnetic sensor, for example, due to differences in chassis and wire resistances. The ground current finds multiple parallel paths by which to make its return, and is not constrained to the ground conductor of the twisted pair. In some instances, coaxial cable is used to minimize the electromagnetic field external to this tightly coupled power rail and return, which may interfere with an adjacent magnetometer. In other implementations, the magnetometer is enclosed within a pair of concentric conducting sheaths for the power and return.

Whatever physical symmetry is employed to minimize power line EM fields, there is always some residual rogue EM field that is seen by the magnetometer.

In some conventional solutions, minimizing magnetic sensor error is accomplished by optimal placement of power rails. However, because the magnetic sensors include multiple magnetometers that cannot occupy the same point in space, error minimization cannot typically be accomplished on all sensitive axes through symmetrical power line placement alone.

In view of the above constraints, there exists a need for improving directional module measurement accuracy by reducing the effects of stray EM fields in the downhole tool.

Aspects of the disclosed technology address the foregoing need by providing multiple techniques for minimizing magnetometer measurement errors in downhole drilling environments. In some approaches, error reduction is performed using software to identify and eliminate measurement errors registered by magnetometers in a directional module as a response to current variation. In such aspects, magnetometer calibration can be performed under known electromagnetic conditions, for example, by varying the currents carried in adjacent power supply lines and measuring various error quantities in x, y, and z-axis magnetic measurement readings. By quantifying the effects of stray EM fields, magnetometer measurements can be error corrected in software/hardware to produce more accurate positional measurements.

In other aspects, error reduction can be accomplished through mechanical intervention, for example, by modifying the positioning of power lines to encourage stray EM field cancellation at or around the directional module. In some implementations, mechanical approaches to EM field cancelation can be informed/improved using a sensor calibration and error mitigation process, as discussed in further detail below.

Figure 1B:
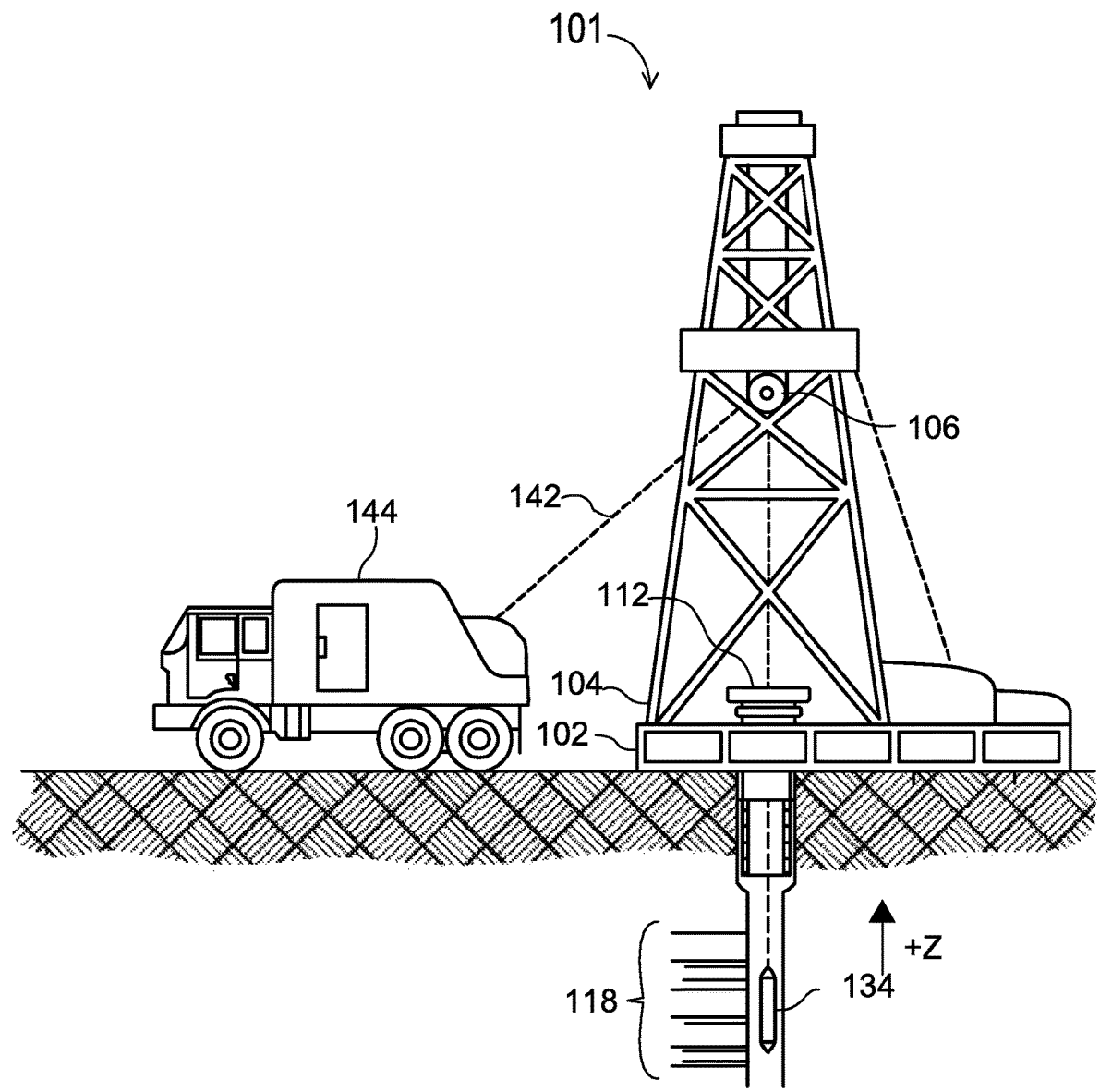
FIG. 1B is a schematic diagram of an example wireline logging environment, in accordance with various aspects of the subject technology.

The disclosure now turns to FIGS. 1A-B, and FIG. 2 to provide a brief introductory description of the larger systems that can be employed to practice the concepts, methods, and techniques disclosed herein. A more detailed description of the methods and systems for implementing the improved semblance processing techniques of the disclosed technology will then follow.

FIG. 1A shows an illustrative drilling environment 100. As illustrated, drilling platform 102 supports derrick 104 having traveling block 106 for raising and lowering drill string 108. Kelly 110 supports drill string 108 as it is lowered through rotary table 112. Drill bit 114 is driven by a downhole motor and/or rotation of drill string 108. As bit 114 rotates, it creates a borehole 116 that passes through various formations 118. Pump 120 circulates drilling fluid through a feed pipe 122 to kelly 110, downhole through the interior of drill string 108, through orifices in drill bit 114, back to the surface via the annulus around drill string 108, and into retention pit 124. The drilling fluid transports cuttings from the borehole into pit 124 and aids in maintaining borehole integrity.

Downhole tool 126 can take the form of a drill collar (i.e., a thick-walled tubular that provides weight and rigidity to aid the drilling process) or other arrangements known in the art. Further, downhole tool 126 can include various sensor and/or telemetry devices, including but not limited to: acoustic (e.g., sonic, ultrasonic, etc.) logging tools and/or one or more magnetic directional sensors (e.g., magnetometers, etc.). In this fashion, as bit 114 extends the borehole through formations 118, the bottom-hole assembly (e.g., directional systems, and acoustic logging tools) can collect various types of logging data. For example, acoustic logging tools can include transmitters (e.g., monopole, dipole, quadrupole, etc.) to generate and transmit acoustic signals/waves into the borehole environment. These acoustic signals subsequently propagate in and along the borehole and surrounding formation and create acoustic signal responses or waveforms, which are received/recorded by evenly spaced receivers. These receivers may be arranged in an array and may be evenly spaced apart to facilitate capturing and processing acoustic response signals at specific intervals. The acoustic response signals are further analyzed to determine borehole and adjacent formation properties and/or characteristics.

For purposes of communication, a downhole telemetry sub 128 can be included in the bottom-hole assembly to transfer measurement data to surface receiver 130 and to receive commands from the surface. In some implementations, mud pulse telemetry may be used for transferring tool measurements to surface receivers and receiving commands from the surface; however, other telemetry techniques can also be used, without departing from the scope of the disclosed technology. In some embodiments, telemetry sub 128 can store logging data for later retrieval at the surface when the logging assembly is recovered. These logging and telemetry assemblies consume power, which must often be routed through the directional sensor section of the drill string, thereby producing stray EM fields which interfere with the magnetic sensors.

At the surface, surface receiver 130 can receive the uplink signal from downhole telemetry sub 128 and can communicate the signal to data acquisition module 132. Module 132 can include one or more processors, storage mediums, input devices, output devices, software, and the like as described in further detail below. Module 132 can collect, store, and/or process the data received from tool 126 as described herein.

At various times during the drilling process, drill string 108 may be removed from the borehole as shown in example environment 101, illustrated in FIG. 1B. Once drill string 108 has been removed, logging operations can be conducted using a downhole tool 134 (i.e., a sensing instrument sonde) suspended by a conveyance 142. In one or more embodiments, the conveyance 142 can be a cable having conductors for transporting power to the tool and telemetry from the tool to the surface. Downhole tool 134 may have pads and/or centralizing springs to maintain the tool near the central axis of the borehole or to bias the tool towards the borehole wall as the tool is moved downhole or uphole.

Downhole tool 134 can include various directional and/or acoustic logging instruments that collect data within borehole 116. A logging facility 144 includes a computer system, such as those described with reference to FIG. 6, discussed below, for collecting, storing, and/or processing the measurements gathered by logging tool 134. In one or more embodiments, the conveyance 142 of downhole tool 134 can be at least one of wires, conductive or non-conductive cable (e.g., slickline, etc.), as well as tubular conveyances, such as coiled tubing, pipe string, or downhole tractor. Downhole tool 134 can have a local power supply, such as batteries, downhole generator and the like. When employing non-conductive cable, coiled tubing, pipe string, or downhole tractor, communication can be supported using, for example, wireless protocols (e.g. EM, acoustic, etc.), and/or measurements and logging data may be stored in local memory for subsequent retrieval.

Although FIGS. 1A and 1B depict specific borehole configurations, it is understood that the present disclosure is equally well suited for use in wellbores having other orientations including vertical wellbores, horizontal wellbores, slanted wellbores, multilateral wellbores and the like. While FIGS. 1A and 1B depict an onshore operation, it should also be understood that the present disclosure is equally well suited for use in offshore operations. Moreover, the present disclosure is not limited to the environments depicted in FIGS. 1A and 1B, and can also be used in either logging-while-drilling (LWD) or measurement while drilling (MWD) operations.

Figure 2A:
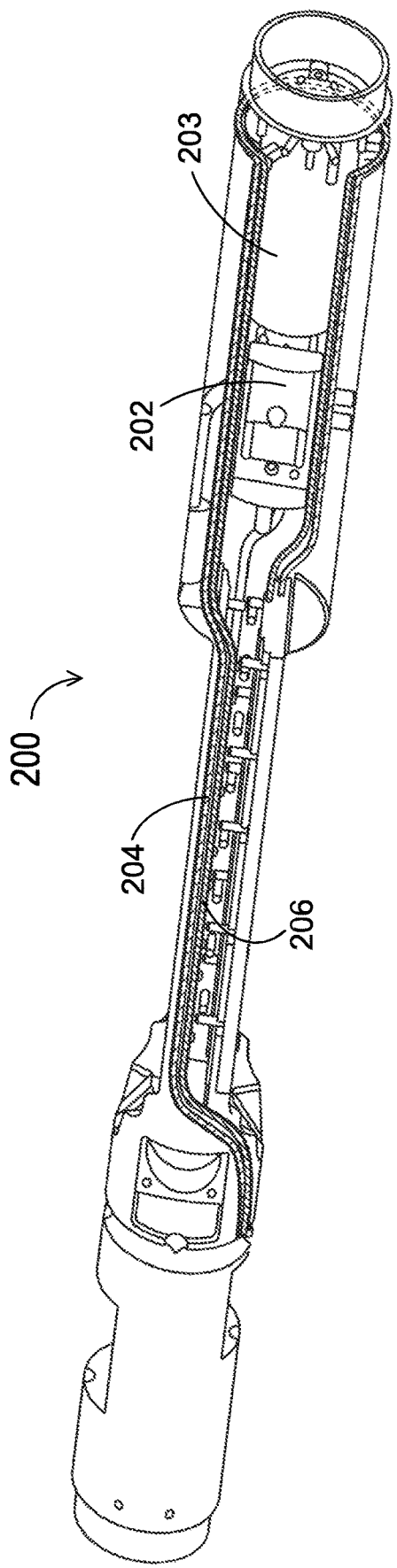
FIG. 2A is a perspective view of a downhole tool that includes a directional module, in accordance with various aspects of the subject technology.

FIG. 2A is a perspective view of a downhole module 200 that includes a directional magnetometer 202 of the disclosed technology. Directional magnetometer 202 is enclosed in a chassis 203. The downhole module 200 is concentrically retained within a drill collar of the downhole tool (not shown). As discussed in further detail below, chassis 203 can provide an electrical ground for one or more power supplies used to power various sensors and systems within downhole module 200 (not shown). Downhole module 200 includes two power rails (204, 206), that are configured to provide power from one or more power supplies (e.g., batteries) to one or more module/s and/or sensor/s within or adjacent to downhole module 200. Although the illustrated example provides two power rails, it is understood that a greater (or fewer) number can be implemented in downhole tool 200, without departing from the scope of the disclosed technology.

Power rails 204, 206 are each divided into two respective conductive branches to provide a split current path around directional magnetometer 202. In some aspects, the wire path of each conductive branch is mechanically embedded in, and guided by grooves in chassis 203. Wire grooves can be configured to facilitate positional adjustment of the conductive branches, e.g., by permitting movement of the conductive branches between grooves, for example, to maximize EM field cancelation via mechanical re-positioning along radial angles with respect to the magnetic sensor. As discussed in further detail below with respect to FIGS. 4A/B, adjustable grooves can also be configured to have different depths, for example, to maximize EM field cancelation via mechanical re-positioning at radial distances with respect to the magnetic sensor.

In the illustrated case, each power rail is shown to be split into two conductive branches, for example, that are positioned at 180 degrees on either side of directional magnetometer 202, e.g., to maximize cancelation of EM fields resulting from current transmission. However, other geometries are contemplated. For example, each power rail could be split into three conductive branches spaced at 120 degrees about directional magnetometer 202. In another example, each power rail could be split into four conductive branches spaced at 90 degrees around directional magnetometer 202. It is understood that a greater number of conductive branches can be used to split a current path around directional magnetometer 202, without departing from the scope of the technology.

In some aspects, each of the conductive branches is configured such that an equal proportion of current coming from the power rail flows down a respective branch. For example, in implementations with two conductive branches, the branches may be configured such that 50% of the current flows down the first branch and 50% down the second branch. In another aspect, where four conductive branches are implemented, 25% of the total current carried on the corresponding rail may be carried in each branch. As such, in some preferred embodiments, impedance properties between branches are kept as equal as possible, for example, by ensuring that the branches are made of similar conductive materials, of similar gauge, length, and kept at similar temperatures, etc.

Figure 2B:
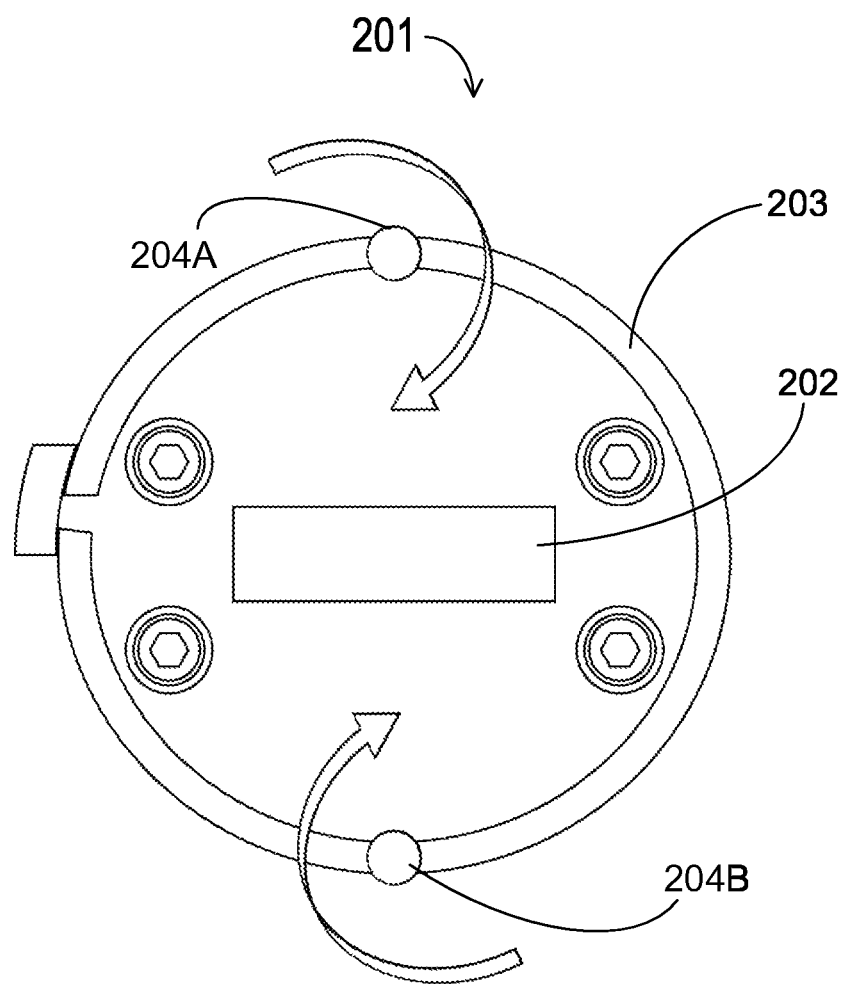
FIG. 2B is a cross-sectional view of a magnetic sensor that is used in a directional module configured to minimize stray electromagnetic (EM) field interference, in accordance with various aspects of the subject technology.

FIG. 2B is a cross-sectional view of a magnetic sensor that is used in a directional module 200 configured to minimize stray electromagnetic (EM) field interference. However, in this example, only conductive branches 204A, 204B, corresponding with power rail 204 are shown on either side of directional magnetometer 202 (not shown, but behind the connector). In this configuration, conductive branches 204A, 204B are separated by 180 degrees. Ideally, each carries 50% of the current load from power rail 204. The direction of EMI produced by current on each conductive branch (204A, 204B) is also illustrated. It can be seen that the orientation of conductive branches 204A and 204B around directional magnetometer 202 encourages cancelation of EMI components in the center of chassis 203 and directional magnetometer 202. As discussed above, adjustable grooves in chassis 203 can be provided to permit the tuning of conductive branches 204A, 204B, for example, by embedding the conductive branches in different grooves. In some instances, measurement errors generated by one or more magnetometers in directional module 200 can be monitored as physical adjustments (position changes) are made to the conductive branches, for example, to determine locations/geometries of the directional magnetometer 202 and conductive branches that minimize sensor error. As discussed in further detail below, measurement errors can also be monitored as current loads are varied, either through manual (or automatic) alterations to impedance characteristics of one or more of the conductive branches.

Some amount of error generated by directional magnetometer 202 is due to the fact that all magnetometers cannot occupy the same location in space. As such, splitting a current path around the directional module (e.g., through placement of various conductive branches), cannot achieve geometric symmetry for all magnetometers simultaneously. Therefore, positioning constraints result in some amount of magnetic sensor error due to magnetometer size, placement, and manufacturing variance.

Figure 3A:
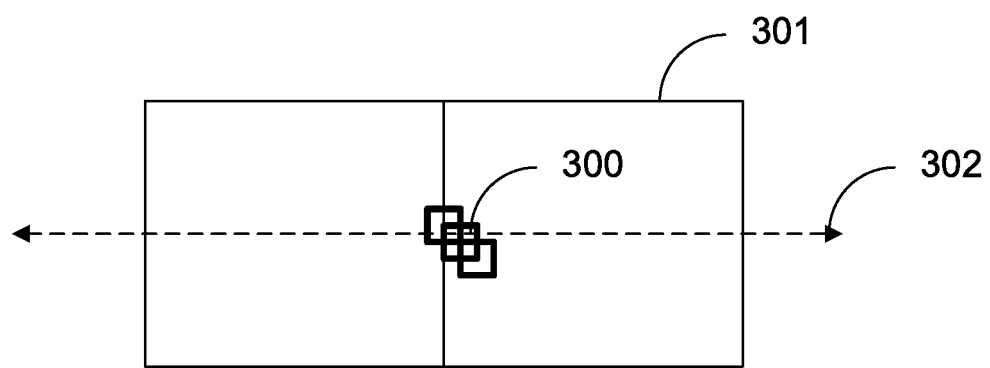
FIG. 3A is a schematic diagram of a directional module positioned within a directional module chassis, in accordance with various aspects of the subject technology.

FIG. 3A conceptually illustrates placement of a magnetic sensor 300, comprising multiple magnetometers, in a directional chassis 301. As illustrated, each of the magnetometers occupy a different space within the interior volume of chassis 301. As such, split current paths (e.g., provided in chassis 301) cannot be symmetrically/equally separated in distance from each of the magnetometers. Those of skill in the art would recognize that similar constraints contribute to accelerometer error for accelerometers in a downhole tool. For example, manufacturing variance and space constraints make it difficult to completely eliminate the effects of centrifugal forces due to the attendant difficulties in accurately placing all accelerometers along a rotational axis (e.g., axis 302), within the interior volume of the downhole tool.

As discussed above, magnetic sensor errors that cannot be eliminated with symmetric current path placement can be further mitigated using software and/or firmware controls that correct for the residual current-dependent magnetic field errors. Systems and methods for mitigating magnetic sensor errors using error correction techniques are discussed in further detail with respect to FIG. 3B.

Figure 3B:
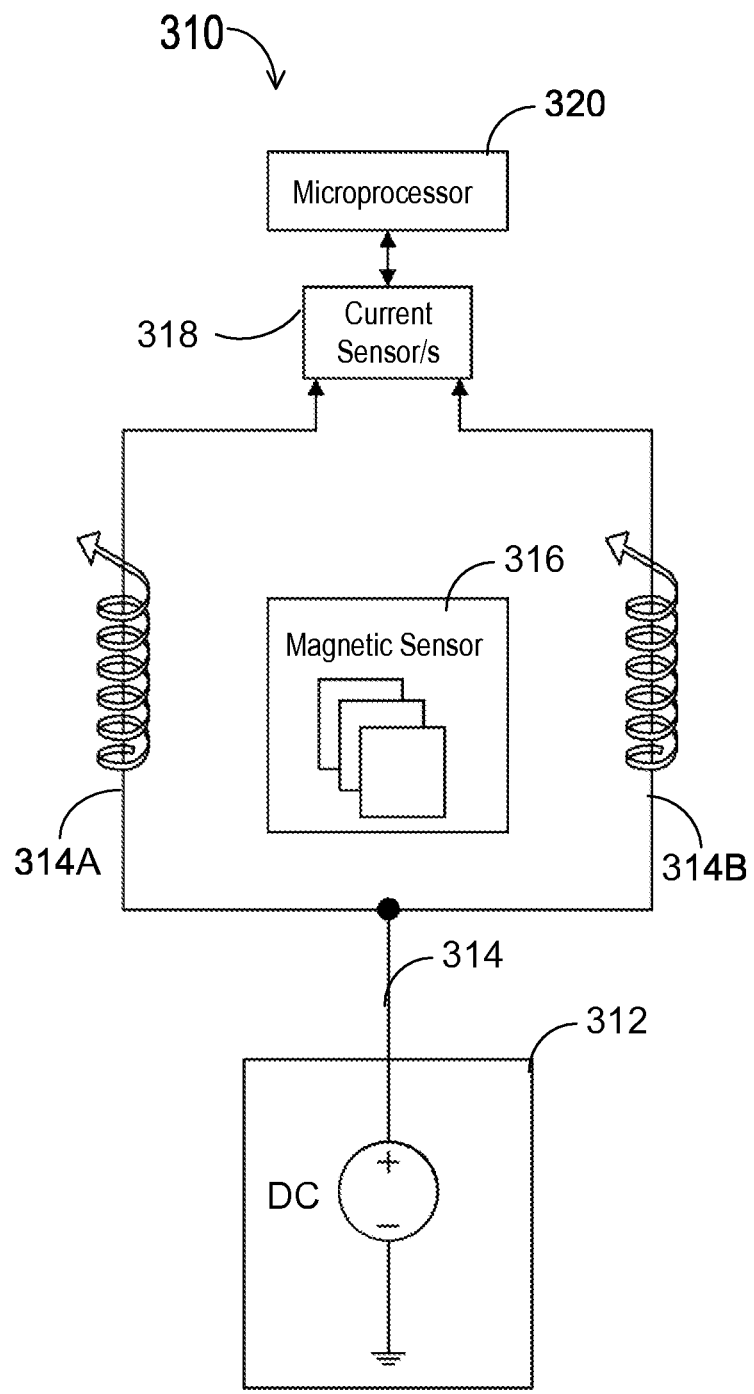
FIG. 3B is a schematic diagram of a directional module, in accordance with various aspects of the subject technology.

Specifically, FIG. 3B illustrates an example directional module 310 that can be used for associating EMI error measurements with current loads, for example, to facilitate the removal/reduction of sensor errors. Directional module 310 includes power supply 312, that is configured to provide power via power rail 314. As illustrated, power rail 314 splits into two conductive branches 314A, 314B, in order to provide a split current path around magnetic sensor 316. The split current path provided by conductive branches 314A, 314B is rejoined and provided to one or more current sensor/s 318 coupled to microprocessor 320. In keeping with Orsted's law, the magnetic sensor is positioned equidistant from branches 314A and 314B in order to facilitate cancelation of the EM fields at the location of the magnetic sensor. It is understood that additional power supplies, power rails and/or additional conductive branches can be implemented, without departing from the scope of the disclosed technology.

As discussed above, power rail 314 and resulting conductive branches 314A, 314B, can be mechanically guided by a chassis (not illustrated) that encloses magnetic sensor 316. In some aspects, the chassis can also enclose one or more of: power supply 312, current sensor/s 318, and/or microprocessor 320. However, it is understood that power supply 312, current sensor/s 318 and/or microprocessor 320 can reside in a physical location outside of the chassis, such as in another portion of the downhole tool, or at a remote surface station, etc., without departing from the scope of the disclosed technology.

In practice, microprocessor 320 can be configured to correlate current loads measured by current sensors 318, with error measurements detected from one or more magnetometers in magnetic sensor 316. Associations between changing current loads and changing error measurements can later be used to eliminate errors picked up by magnetic sensor 316, for example, caused by changing EMI field strengths induced by changing currents flowing in conductive branches 314A/B.

In one aspect, calibration of magnetic sensor 316 can be performed in a controlled setting (e.g., in a laboratory) where magnetic field errors can be quantified under controlled EM field conditions, and associated with known current loads, e.g., as measured by current sensor/s 318. In such aspects, current sensor 318 can include a single current sensor that measures the sum of currents received via conductive branches 314A/B. In such approaches, changes to current can be induced by manually altering (increasing or decreasing) impedance in one or more of the conductive branches 314A/B, or in the power rail 314. Changing current quantities are associated with changes in measurement error received at magnetic sensor 316. Associations between changing current loads and measurement errors in magnetic sensor 316 can be stored in an error table, for example, that can be used to error-correct sensor readings when magnetic sensor 316 is deployed in a downhole environment. An ideal calibration correction would result in no changes in magnetometer measurements within magnetic sensor 316, despite dramatic changes in current flowing through current rail 314.

In another aspect, calibration of magnetic sensor 316 can be performed in situ. For example, microprocessor 320 can be configured to alter/re-program impedance characteristics of power rail 314, and/or one or more of conductive branches 314A/B (e.g. by switching on a downstream resistive load). By providing the ability to adjust impedance (and therefore current) characteristics on-the-fly, in situ calibration of magnetic sensor 316 can be performed, for example, by associating changes in magnetic field measurement with programmed changes in current characteristics. For in situ calibration in a downhole drilling environment, the process employed by the microprocessor 320 and the system must assure that the environment is momentarily stable enough to implement such a calibration. For example, the in situ calibration process cannot attain reliable calibration terms if the drill string is in motion. The process must be delayed until sufficient stability of the magnetic measurements is established, indicating a non-rotating drill string and a constant ambient magnetic field.

In some aspects, current sensor/s 318 can include multiple current sensors, for example, wherein a different current sensor is associated with each conductive branch. In such approaches, differing current loads on each conductive branch can be associated with error measurements of magnetic sensor 316. As a result, different current sensor measurements may be used to calibrate individual current branches, for example, to ensure that they have relatively equal impedance values, or other characteristics that contribute to impedance, such as length, diameter (gauge), material conductivity, and/or temperature, etc.

Figure 4A:
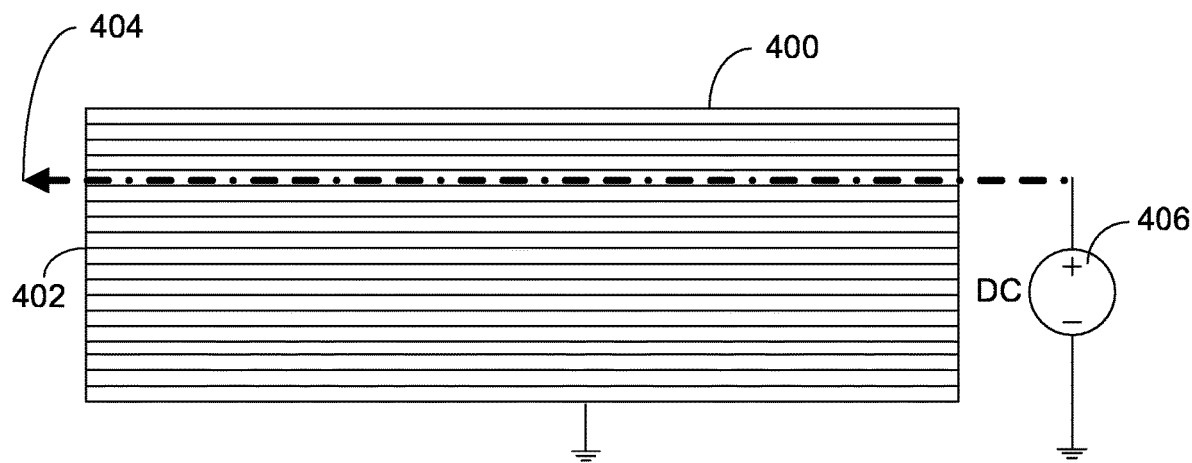
FIG. 4A is a schematic diagram of a directional module chassis that includes wire grooves, in accordance with various aspects of the subject technology.

FIG. 4A is a side-view of a directional module chassis 400 that includes selectable and/or configurable wire grooves 402. Wire grooves 402 can be used to provide re-positioning options for one or more conductive branches (e.g., conductive branch 404), used to split a current path around a magnetic sensor (not shown) enclosed within chassis 400. By way of example, current provided by power supply 406 can flow from a power rail (not indicated) into conductive branch 404 provided by a wire (or other conductor) that is disposed within one of wire grooves 402. Magnetic sensor calibrations to reduce sensor error can be performed by re-positioning conductive branch 404 into a different wire groove 402 that has a different circumferential position with respect to the magnetic sensor.

In some aspects, wire grooves 402 can also be configured to facilitate the adjustment of a radial distance between one or more conductive branches and the magnetic sensor. For example, wire grooves 402 can have adjustable depths provided by material layering, such as by using brass sheets, or epoxy, etc. In other aspects, depth variation in wire grooves 402 may be provided by machining grooves with multiple depths, as discussed in further detail with respect to FIG. 4B, below. By providing multiple placement options for the conductive branches, wire grooves 402 disposed in chassis 400 can improve the versatility of the directional module by making it easier for an operator to calibrate the wiring to maximally eliminate EMI.

Figure 4B:
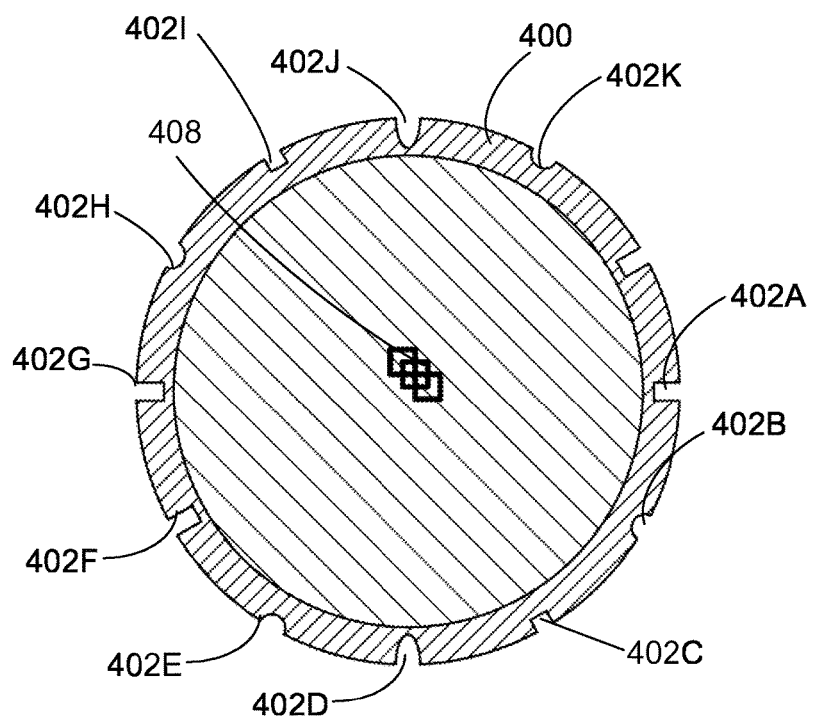
FIG. 4B is a cross-sectional view of a directional module chassis that includes wire grooves and a magnetic sensor, in accordance with various aspects of the subject technology.

FIG. 4B is a cross-sectional view of a directional module chassis 400. As seen in the cross-section view, multiple wire grooves 402 are positioned around the chassis to circumferentially surround magnetic sensor 408. In practice, various conductive branches can be positioned/re-positioned within grooves 402, for example, to reduce measurement errors generated from magnetic sensor 408. In typical deployments, it can be preferable to maximize EMI cancelation, thereby reducing error components for various magnetometers magnetic sensor 408, before applying software/firmware-based error correction, as discussed in further detail with respect to FIG. 5, below. The wire grooves 402 depicted in FIG. 4B illustrate examples of several different groove depths and geometries (e.g., grooves 402A-402K) which permit variable radial positioning of the wire to the sensor within chassis 400. However, it is understood that additional groove depths and/or geometries are contemplated, without departing from the scope of the disclosed technology.

Figure 4C:
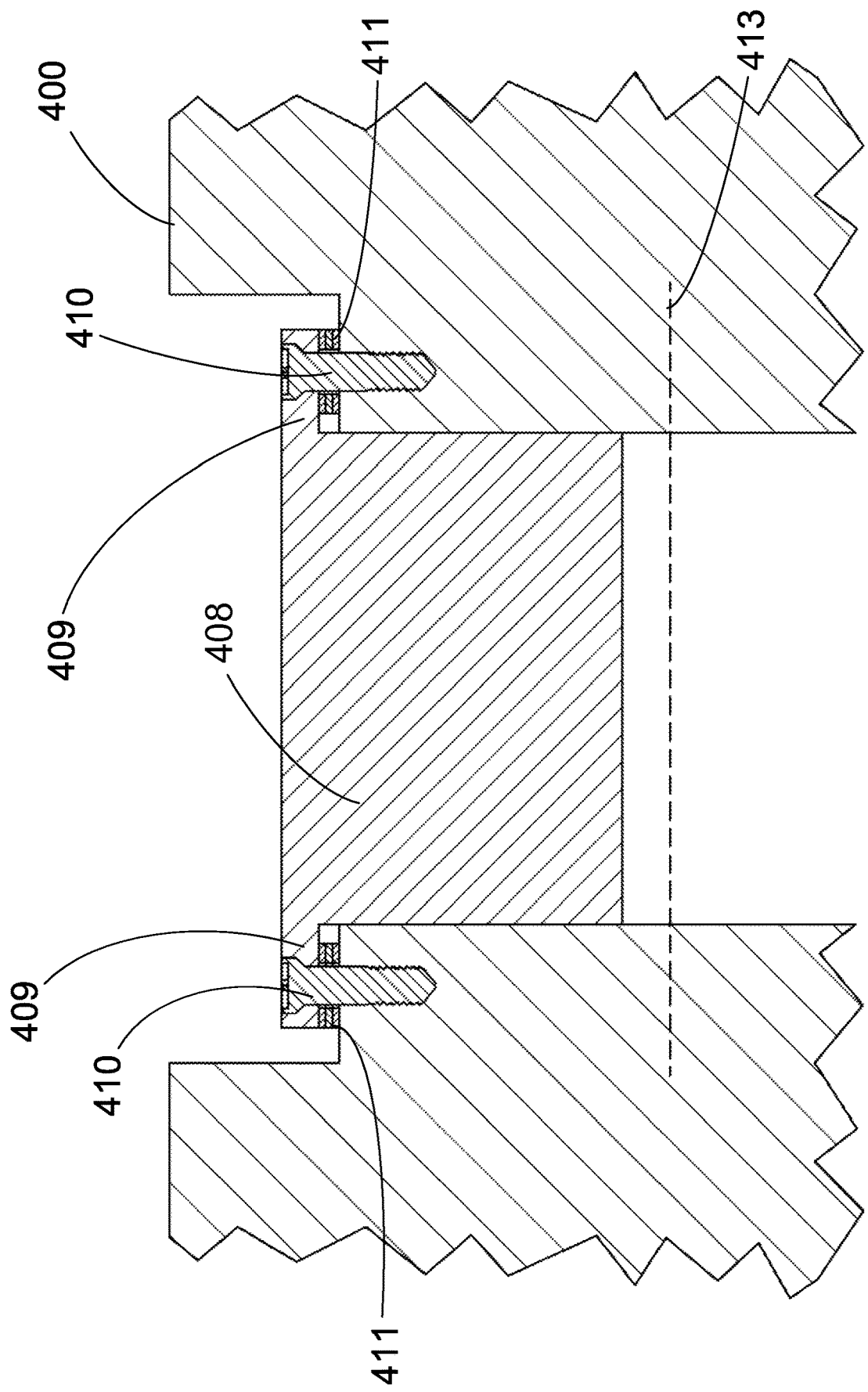
FIG. 4C is a cross-sectional view of a directional module chassis that includes shims for modifying a position of a magnetic sensor, in accordance with various aspects of the subject technology.

FIG. 4C is an example of a cut-away view of a directional module chassis 400 that includes a magnetic sensor 408, as well as shims 411 for adjusting sensor placement within chassis 400. As discussed above, in some aspects, EMI cancelation at the magnetic sensor can be adjusted/optimized by altering a position of magnetic sensor 408 within chassis 400, and with respect to split power conductor branches (not shown). In the example of FIG. 4C, magnetic sensor 408 is coupled to chassis 400 via engagement by sensor ears 409 with a support structure 410. Stackable shims 411 provide for the displacement of sensor 408 by increasing a distance between sensor ears 409 and support structure 410. In some aspects, shims 411 can be configured for modular addition (or removal) from chassis 400 to permit repeated attempts to calibrate sensor 408 placement within chassis 400. It is understood that this process of using shims to optimize mechanical positioning of the magnetic sensor can be done in two axes (e.g. left-right as well as up-down) between the split conductor branches.

Figure 5:
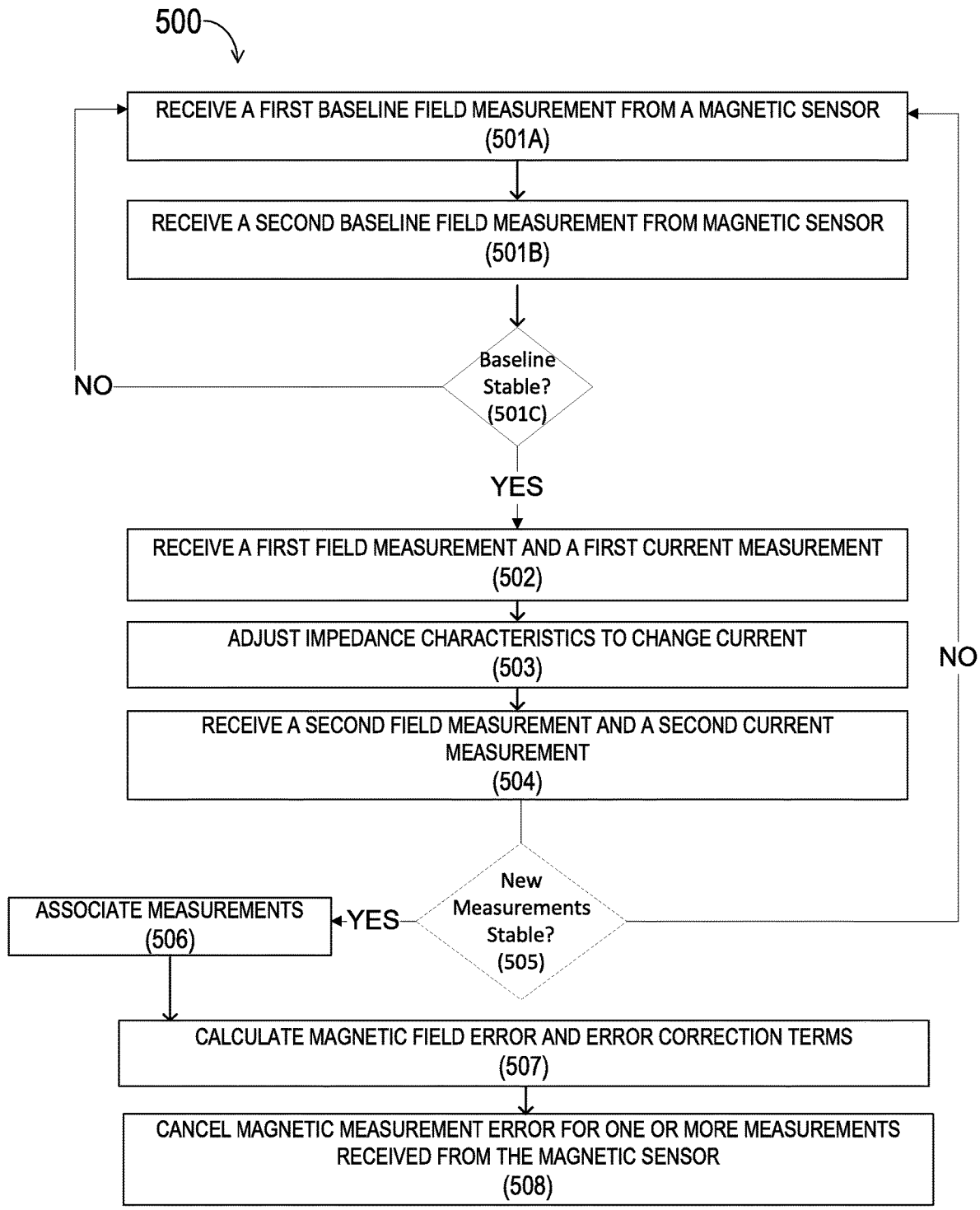
FIG. 5 is a process for detecting and minimizing EM interference in a directional module, in accordance with various aspects of the subject technology.

FIG. 5 is a process 500 for detecting and minimizing EMI in a directional module of the disclosed technology. Process 500 begins when software or firmware instructions are executed, for example, by a microprocessor, to receive current measurements from one or more current sensors. It is understood that all or portions of process 500 can be implemented by various processor-based systems, such as processing system 600, discussed below. Such systems can include processing systems that are deployed on a drilling tool, wireline tool, and/or at a surface control station. That is, some (or all) of the steps of process 500 may be implemented using the same, or different, processing devices.

Additionally, directional module hardware configurations may vary, depending on the desired implementation. In some implementations, a single current sensor can be used to measure current flowing over a given power rail, for example, that is received at the current sensor via one or more conductive branches that split a current path around the magnetic sensor. As discussed above, a single current sensor can be configured to receive current via two or more conductive branches in order to identify an amount of total current flowing around the magnetic sensor. However, in other implementations, additional current sensors can be used. For example, independent current sensors can be used to separately detect current on each conductive branch of a given power rail. Alternatively, a single current sensor can be used to receive current from a subset of the total number of conductive branches associated with a given power rail. In such implementations, current sensors can be used to compare the amount of current flowing over different conductive branches for the same power rail. Using independent current sensors to detect differences in current loads between conductive branches can help to identify potential causes of sensor error e.g., caused by EMI imbalances.

Process 500 begins with steps 501A and 501B in which first and second baseline field measurements are received from a magnetic sensor. In practice, the first and second baseline field measurements are magnetic readings taken from the same magnetic sensor at different times. This is done to ensure that the magnetic sensor is in a state of stable operation. The baseline field measurements can be collected under ideal or controlled conditions, such as when electromagnetic interference has been minimized or eliminated. For example, baseline measurements may be taken in the absence of proximately located DC current flows.

In step 501C, stability of the baseline field measurements is determined, e.g., by comparing the first and second baseline field measurements. If unacceptable differences are detected then process 500 loops back to step 501A, and a new first baseline magnetic field measurement is collected. However, if the first and second baseline field measurements are the same, then it is determined that the baseline is stable, and process 500 proceeds to step 502 in which a first field measurement and a first current measurement are received/collected. In practice, magnetic field measurements from all magnetometer axes are checked for stability.

In step 502, the first field measurement is received from the magnetic sensor, and the first current measurement is received from one or more current sensors, depending on the desired current sensor configuration, as discussed above. The first field and current measurements are simultaneous measurements such that the field measurement represents the magnetic sensor output at a time when an amount of current (indicated by the first current measurement) is flowing through conductive branches around the magnetic sensor.

In step 503, an impedance of one or more power rails and/or conductive branches is altered e.g., to change the corresponding current load. As discussed above, the alteration of impedance characteristics can be performed manually (e.g., by adding or subtracting resistive elements), or electronically (e.g., by altering impedance characteristics using one or more microprocessors). Changes to currents received at the current sensor/s can result from manual changes to the electrical resistance of one or more conductive branches adjacent to the magnetic sensor, or directly to the power rail supplying current to the conductive branches. In some approaches, changing current conditions may be performed in a controlled setting, such as a laboratory, where EM field characteristics around the magnetic sensor are accurately known and/or controlled. In implementations where impedance changes are controlled electronically, one or more microprocessors can be used to re-program impedance characteristics of select conductive branches in the directional module. This may be accomplished, for example, by switching on an additional resistive current path to ground on one or more of the power rail branches, or on the rejoined power rail downstream.

In step 504, a second field measurement and a second current measurement are collected/received. Similar to step 501, the second field and current measurements are simultaneous measurements, that is, the second field measurement represents the magnetic field measured by the magnetic sensor at a time when a different current (indicated by the second current measurement) is flowing around the magnetic sensor.

In optional step 505, the stability of the first field/current measurements and/or the second field/current measurements can be established. For example, stability of the first/second field and measurements may be determined by comparing multiple measurements taken at different times (while keeping current loads constant). It is understood that determining the stability of the field measurements can be performed at different points in the sequence of process 500, without departing from the scope of the technology. For example, stability of the first field measurements can be verified after the first field/current measurements are collected in step 502. Alternatively, stability of first and/or second field measurements can be determined after collection of the second field/current measurements performed at step 504. If the various field measurements are not stable, process 500 can start again by reverting back to step 501A. Alternatively, if all measurements are determined to be stable, then process 500 can advance to step 506.

In step 506, the first field measurement is associated with the first current measurement, and the second field measurement is associated with the second current measurement.

At step 507, magnetic field error and error correction terms are calculated based on the measurements taken at steps 502 and 504. In some aspects, magnetic field error is calculated as the difference between the first field measurement (step 502), and second field measurement (step 504). The error correction term is calculated as the ratio of the magnetic field error to the change in current, e.g., as indicated by the first current measurement (step 502), and the second current measurement (step 504).

In some implementations, at step 507, the altered impedance (applied at step 503) is removed to return to initial conditions. In such approaches, the magnetic baseline can be re-verified, for example, to confirm that it is (still) stable and unchanged as compared to the value ascertained in steps 501A and 501B. If the newly measured magnetic baseline is shifted from the original baseline determined at steps 501A and 501B, process 500 can restart by reverting back to step 501A. In some aspects, the stability of the magnetic field and current measurements may be determined by calculating the variance or standard deviation of multiple fast measurements made over an averaging interval.

If the newly measured magnetic baseline measurements are determined to be stable, process 500 advances to step 508 in which (future) magnetic measurement errors are canceled for one or more measurements received by the magnetic sensor. Error cancelation can be performed by applying the error correction term to the magnetic sensor measurements as a function of current. As discussed above, measurements from the magnetic sensor can be improved by removing error(s) caused by the uncorrected magnetic sensor's dependence upon current in the power rail.

Depending on the desired implementation, all (or portions) of process 500 can be performed in situ, as discussed above. Programmatically controlling current loads in the conductive branches can facilitate on-the-fly calibration and testing of the directional module, for example, in a borehole environment. Calibration of the magnetic sensor's sensitivity to current must be done under stable conditions, for example, during drill pipe connections when the drill string is not rotating. Once the calibration correction terms have been determined and verified to be effective at minimizing EM interference errors on the magnetic sensors, they can be applied at high speed (e.g., every millisecond) while the drill string is rotating.

FIG. 6 illustrates an example processing device 600 suitable for implementing a process of the disclosed technology. Device 600 includes interfaces 602, a central processing unit (CPU) 604, and a bus 610 (e.g., a PCI bus). When acting under the control of appropriate software and/or firmware controls, the CPU can execute instructions for performing process 500, discussed above with respect to FIG. 5. CPU 604 can accomplish all these functions under the control of software and/or firmware including an operating system and any appropriate applications software. CPU 604 may include one or more processors 608, such as a processor from the Intel X86 family of microprocessors. In some cases, processor 608 can be specially designed hardware for controlling various operations of a directional module, as discussed above. In some cases, a memory 606 (e.g., non-volatile RAM, ROM, etc.) also forms part of CPU 604. However, there are many different ways in which memory could be coupled to the system.

Interfaces 602 can be configured to acquire data and measurements from one or more computing and/or sensor systems, such as a magnetic sensor implemented in a directional module of the disclosed technology. In some cases, interfaces 602 may also include one or more additional independent processor(s) and, in some instances, separate on-board memory.

Although the system shown in FIG. 6 is one specific processing device of the present invention, it is by no means the only device architecture on which the present invention can be implemented. Further, other types of interfaces and media could also be used with processing device 600.

Regardless of the configuration of processing device 600, it may employ one or more memories or memory modules (including memory 606) configured to store program instructions to perform the methods disclosed herein. In some implementations, the program instructions may be configured to cause CPU 604 and/or processor 608 to perform operations for performing data gathering and calculations necessary to facilitate error cancelation for one or more magnetic sensor measurement(s), i.e., by applying error correction term(s) to magnetic sensor measurements as a function of current.

The various embodiments described above are provided by way of illustration only and should not be construed to limit the scope of the disclosure. For example, the principles herein apply equally to optimization as well as general improvements. Various modifications and changes may be made to the principles described herein without following the example embodiments and applications illustrated and described herein, and without departing from the spirit and scope of the disclosure. Claim language reciting "at least one of" a set indicates that one member of the set or multiple members of the set satisfy the claim.

Statements of the Disclosure

Statement 1: a system comprising: a chassis; a magnetic sensor disposed within the chassis, wherein the magnetic sensor is coupled to a microprocessor; a first current sensor coupled to the microprocessor; and a first power rail electrically coupled to the first current sensor via a first conductive branch and a second conductive branch, wherein the first conductive branch and the second conductive branch are affixed to the chassis and provide a split current path around the magnetic sensor, and wherein the microprocessor is configured to perform operations comprising: receiving a first current measurement from the first current sensor, wherein the first current measurement is associated with electrical current received at the first current sensor via the first conductive branch and the second conductive branch; receiving a first magnetic field measurement from the magnetic sensor, and associating the first current measurement from the first current sensor with the first field measurement from the magnetic sensor.

Statement 2: the system of statement 1, wherein the microprocessor is further configured to perform operations comprising: receiving a second current measurement from the first current sensor, wherein the second current measurement is different from the first current measurement; receiving a second field measurement from the magnetic sensor, and associating the second current measurement with the second field measurement.

Statement 3: the system of any of statements 1-2, wherein the microprocessor is further configured to perform operations comprising: automatically canceling measurement error provided by the magnetic sensor based on the first field measurement and the second field measurement.

Statement 4: the system of any of statements 1-3, wherein the microprocessor is further configured to perform operations comprising: adjusting an impedance of one or more of the first conductive branch or the second conductive branch.

Statement 5: the system of any of statements 1-4, wherein electromagnetic interference (EMI) received by the magnetic sensor is mitigated, at least in part, by electromagnetic field cancelation caused by placement of the first conductive branch and the second conductive branch.

Statement 6: the system of statements 1-5, wherein the first conductive branch and the second conductive branch are configured to be removably embedded in one or more of a plurality of wire grooves disposed within the chassis.

Statement 7: the system of any of statements 1-6, wherein the microprocessor is further configured to perform operations comprising: a second current sensor coupled to the microprocessor; and a second power rail electrically coupled to the second current sensor via a third conductive branch and a fourth conductive branch.

Statement 8: the system of any of statements 1-7, wherein at least one of a plurality of wire grooves disposed in the chassis is configured to have an adjustable depth.

Statement 9: the system of any of statements 1-8, wherein the magnetic sensor is configured to have an adjustable position within the chassis.

Statement 10: the system of any of statements 1-9, wherein the first conductive branch and the second conductive branch are configured to have a substantially equal length.

Statement 11: the system of any of statements 1-10, wherein the first conductive branch and the second conductive branch are configured to have a substantially equal resistance.

Statement 12: the system of any of statements 1-11, wherein the chassis is disposed in an interior volume of a drilling tool, and wherein the chassis further comprises one or more accelerometers disposed on an axis of rotation with respect to the drilling tool.

Statement 13: a method for reducing measurement errors in a directional module, comprising: receiving a first current measurement from a first current sensor, wherein the first current measurement is associated with electrical current received via a first conductive branch and a second conductive branch that form a split current path around a magnetic sensor disposed within a chassis of the directional module; receiving a first field measurement from the magnetic sensor; associating the first current measurement from the first current sensor with the first field measurement from the magnetic sensor; receiving a second current measurement from the first current sensor, wherein the second current measurement is different from the first current measurement; receiving a second field measurement from the magnetic sensor, and associating the second current measurement with the second field measurement.

Statement 14: the method of statement 13, further comprising: canceling measurement error provided by the magnetic sensor based on the first field measurement and the second field measurement.

Statement 15: the method of any of statements 13-14, further comprising: adjusting an impedance of one or more of the first conductive branch or the second conductive branch running around the magnetic sensor.

Statement 16: the method of any of statements 13-15, wherein electromagnetic interference (EMI) received at the magnetic sensor is mitigated, at least in part, by electromagnetic field cancelation caused by placement of the first conductive branch and the second conductive branch.

Statement 17: the method of any of statements 13-16, wherein the first conductive branch and the second conductive branch are configured to be removably embedded in one or more of a plurality of wire grooves within the chassis.

Statement 18: a tangible, non-transitory, computer-readable media having instructions encoded thereon, the instructions, when executed by a processor, are operable to perform operations for: receiving a first current measurement from a first current sensor, wherein the first current measurement is associated with electrical current received via a first conductive branch and a second conductive branch that form a split current path around a magnetic sensor disposed within a chassis of a directional module; receiving a first field measurement from the magnetic sensor; associating the first current measurement with the first field measurement; receiving a second current measurement from the first current sensor, wherein the second current measurement is different from the first current measurement; receiving a second field measurement from the magnetic sensor, and associating the second current measurement with the second field measurement.

Statement 19: the tangible, non-transitory, computer-readable media of statement 18, further comprising instructions to perform operations for: computing a measurement error of the magnetic sensor based on the first field measurement and the second field measurement.

Statement 20: the tangible, non-transitory, computer-readable media of any of statements 18-19, further comprising instructions to perform operations for: adjusting an impedance of one or more of the first conductive branch or the second conductive branch.

What is claimed is:

1. A system comprising:
   a chassis;
   a magnetic sensor disposed within the chassis, wherein the magnetic sensor is communicatively coupled to a microprocessor;
   a first current sensor communicatively coupled to the microprocessor; and
   a first power rail electrically coupled to the first current sensor via a first conductive branch and a second conductive branch, wherein the first conductive branch and the second conductive branch are affixed to the chassis and provide a split current path around the magnetic sensor, and wherein the microprocessor is configured to perform operations comprising:
      receiving a first current measurement from the first current sensor, wherein the
   first current measurement is associated with electrical current received at the first current sensor via the first conductive branch and the second conductive branch;
      receiving a first field measurement from the magnetic sensor; and
      associating the first current measurement from the first current sensor with the first field measurement from the magnetic sensor.

2. The system of claim 1, wherein the microprocessor is further configured to perform operations comprising:
   receiving a second current measurement from the first current sensor, wherein the second current measurement is different from the first current measurement;
   receiving a second field measurement from the magnetic sensor; and
   associating the second current measurement with the second field measurement.

3. The system of claim 2, wherein the microprocessor is further configured to perform operations comprising:
   automatically canceling measurement error provided by the magnetic sensor based on the first field measurement and the second field measurement.

4. The system of claim 1, wherein the microprocessor is further configured to perform operations comprising:
   adjusting an impedance of one or more of the first conductive branch or the second conductive branch.

5. The system of claim 1, wherein electromagnetic interference (EMI) received by the magnetic sensor is mitigated, at least in part, by electromagnetic field cancelation caused by placement of the first conductive branch and the second conductive branch.

6. The system of claim 1, wherein the first conductive branch and the second conductive branch are configured to be removably embedded in one or more of a plurality of wire grooves disposed within the chassis.

7. The system of claim 1, further comprising:
   a second current sensor coupled to the microprocessor; and
   a second power rail electrically coupled to the second current sensor via a third conductive branch and a fourth conductive branch.

8. The system of claim 1, wherein at least one of a plurality of wire grooves embedded in the chassis is configured to have an adjustable depth.

9. The system of claim 1, wherein the magnetic sensor is configured to have an adjustable position within the chassis.

10. The system of claim 1, wherein the first conductive branch and the second conductive branch are configured to have a substantially equal length.

11. The system of claim 1, wherein the first conductive branch and the second conductive branch are configured to have a substantially equal resistance.

12. The system of claim 1, wherein the chassis is disposed in an interior volume of a drilling tool, and wherein the chassis further comprises one or more accelerometers disposed on an axis of rotation with respect to the drilling tool.

13. A method for reducing measurement errors in a directional module, comprising:
   receiving a first current measurement from a first current sensor, wherein the first current measurement is associated with electrical current received via a first conductive branch and a second conductive branch that form a split current path around a magnetic sensor disposed within a chassis of the directional module;
   receiving a first field measurement from the magnetic sensor;
   associating the first current measurement from the first current sensor with the first field measurement from the magnetic sensor;
   receiving a second current measurement from the first current sensor, wherein the second current measurement is different from the first current measurement;
   receiving a second field measurement from the magnetic sensor; and
   associating the second current measurement with the second field measurement.

14. The method of claim 13, further comprising:
   computing a measurement error of the magnetic sensor based on the first field measurement and the second field measurement.

15. The method of claim 13, further comprising:
   adjusting an impedance of one or more of the first conductive branch or the second conductive branch running around the magnetic sensor.

16. The method of claim 13, wherein electromagnetic interference (EMI) received at the magnetic sensor is mitigated, at least in part, by electromagnetic field cancelation caused by placement of the first conductive branch and the second conductive branch.

17. The method of claim 13, wherein the first conductive branch and the second conductive branch are configured to be removably embedded in one or more of a plurality of wire grooves within the chassis.

18. A tangible, non-transitory, computer-readable media having instructions encoded thereon, the instructions, when executed by a processor, are operable to perform operations for:
- receiving a first current measurement from a first current sensor, wherein the first current measurement is associated with electrical current received via a first conductive branch and a second conductive branch that form a split current path around a magnetic sensor disposed within a chassis of a directional module;
- receiving a first field measurement from the magnetic sensor;
- associating the first current measurement with the first field measurement;
- receiving a second current measurement from the first current sensor, wherein the second current measurement is different from the first current measurement;
- receiving a second field measurement from the magnetic sensor; and
- associating the second current measurement with the second field measurement.

19. The tangible, non-transitory, computer-readable media of claim 18, further comprising:
- computing a measurement error of the magnetic sensor based on the first field measurement and the second field measurement.

20. The tangible, non-transitory, computer-readable media of claim 18, further comprising:
- adjusting an impedance of one or more of the first conductive branch or the second conductive branch.

* * * * *